United States Patent [19]

Gosser

[11] Patent Number: 4,970,470
[45] Date of Patent: Nov. 13, 1990

[54] DC-COUPLED TRANSIMPEDANCE AMPLIFIER

[75] Inventor: Royal A. Gosser, Reidsville, N.C.

[73] Assignee: Analog Devices, Incorporated, Norwood, Mass.

[21] Appl. No.: 419,192

[22] Filed: Oct. 10, 1989

[51] Int. Cl.$^5$ ............................................. H03F 3/45
[52] U.S. Cl. .................................... 330/252; 330/258; 330/255
[58] Field of Search ............... 330/252, 255, 258, 260, 330/261, 263, 265

[56] References Cited

U.S. PATENT DOCUMENTS 3,944,944  3/1976  Ellenbecker et al. ........... 330/263 X
4,229,705  10/1980  Tukahashi et al. ................ 350/258
4,595,883  6/1986  Nakayama ........................... 330/255

Primary Examiner—Steven Mottola
Attorney, Agent, or Firm—Parmelee, Bollinger & Bramblett

[57] ABSTRACT

An integrated-circuit (IC) transimpedance amplifier having a successive series of DC-coupled balanced symmetrical amplifier stages with overall current feedback. The input stage includes a pair of series-connected NPN/PNP transistor with common emitters serving as the inverting input terminal. The second stage includes a cross-coupled transistor quad with the bases of the first quad pair coupled to the collectors of the first stage transistors. The inter-stage coupling circuit includes a series string of diodes connected between the collectors of the first stage transistor pair. The input stage transistor pair is identical to the transistor pairs of the second stage quad, and all of those transistors carry identical DC currents. An output stage amplifier is driven by a signal from the collectors of the first transistor pair of the second stage quad. The second transistor pair of the quad is coupled to the output stage through current mirrors to augment the output signal.

17 Claims, 3 Drawing Sheets 4,970,470

DC-COUPLED TRANSIMPEDANCE AMPLIFIER

BACKGROUND OF THE INVENTION

1. Field of the Invention

This invention relates to integrated-circuit (IC) amplifiers. More particularly, this invention relates to amplifiers of the transimpedance type, comprising a successive series of stages with current feedback.

2. Description of the Prior Art

IC amplifiers of the transimpedance type have been available for some time, employing current feedback to achieve DC and AC precision with high loop gain. Such amplifiers consist of a successive series of DC coupled amplifier stages, commonly including a stage of the so-called "folded cascode" type to provide stability. Prior art DC-coupled amplifiers however have suffered important disadvantages, particularly undesirable high frequency distortion and low large-signal bandwidth. Still other aspects of such prior amplifier designs require improvement to meet the needs of modern precision components.

SUMMARY OF THE INVENTION

In a preferred embodiment of the invention, to be described hereinbelow in detail, there is provided a transimpedance amplifier comprising a successive series of DC-coupled stages with overall current feedback. High gain is achieved by the use of a cross-coupled quad (two transistor pairs) arranged as a transconductance amplifier to provide current gain. This gain stage reduces distortion that otherwise would occur due to non-linearities in the output stage. The input signal to this cross-coupled stage is supplied from the preceding stage through a low-impedance bias-generating circuit which assures proper quiescent DC voltages and currents for both stages by providing essentially zero differential mode gain, thereby minimizing the effect of mismatches such as in base currents. AC gain remains high because the signal voltages across the bias-generating circuit are common mode so that negligible AC signal current flows through the bias-generating circuit.

Other objects, aspects and advantages of the invention will in part be pointed out in, and in part apparent from, the following detailed description considered together with the accompanying drawings.

DESCRIPTION OF THE PREFERRED EMBODIMENT

Figure 1:
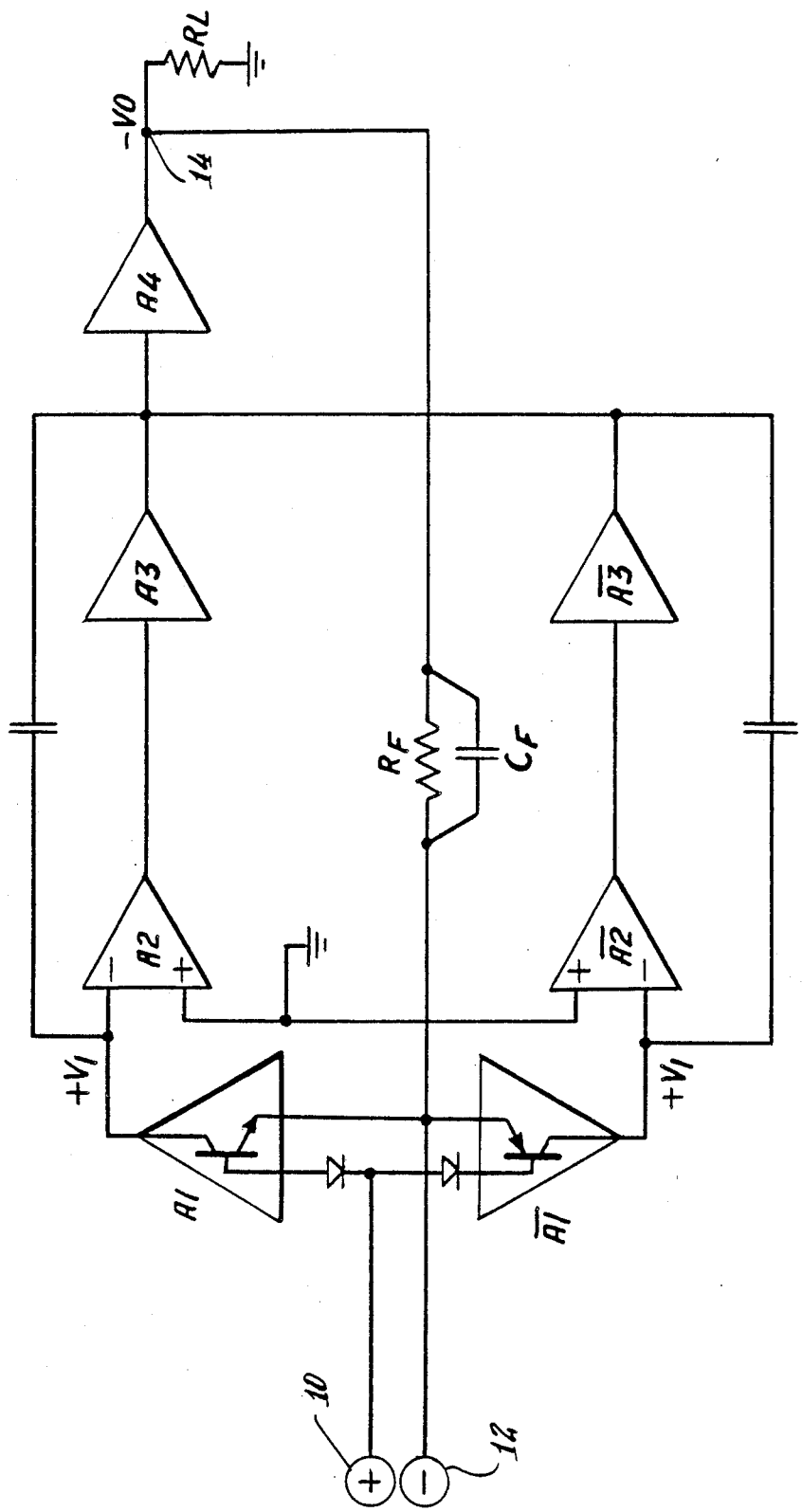
FIG. 1 is a block diagram showing the main elements of the amplifier.

Referring first to FIG. 1, the amplifier basically comprises three balanced symmetrical complementary stages A1, A2 and A3, followed by a fourth complementary output (buffer) stage A4 supplying an output voltage signal to a load $R_L$. The non-inverting input terminal 10 is connected to the common point between a pair of diodes providing bias voltages for the complementary input transistors Q31 and Q32. The inverting input terminal is connected to the common emitter junction of those transistors, which junction also receives feedback current through the (external) feedback resistor RF (e.g., 300, 1K or 2K ohms) connected between that junction and the output terminal 14. The amplifier is operable in inverting mode by grounding the non-inverting input terminal, or in non-inverting mode by connecting the inverting input terminal to ground. The input stage has a low input impedance.

Figure 2A:
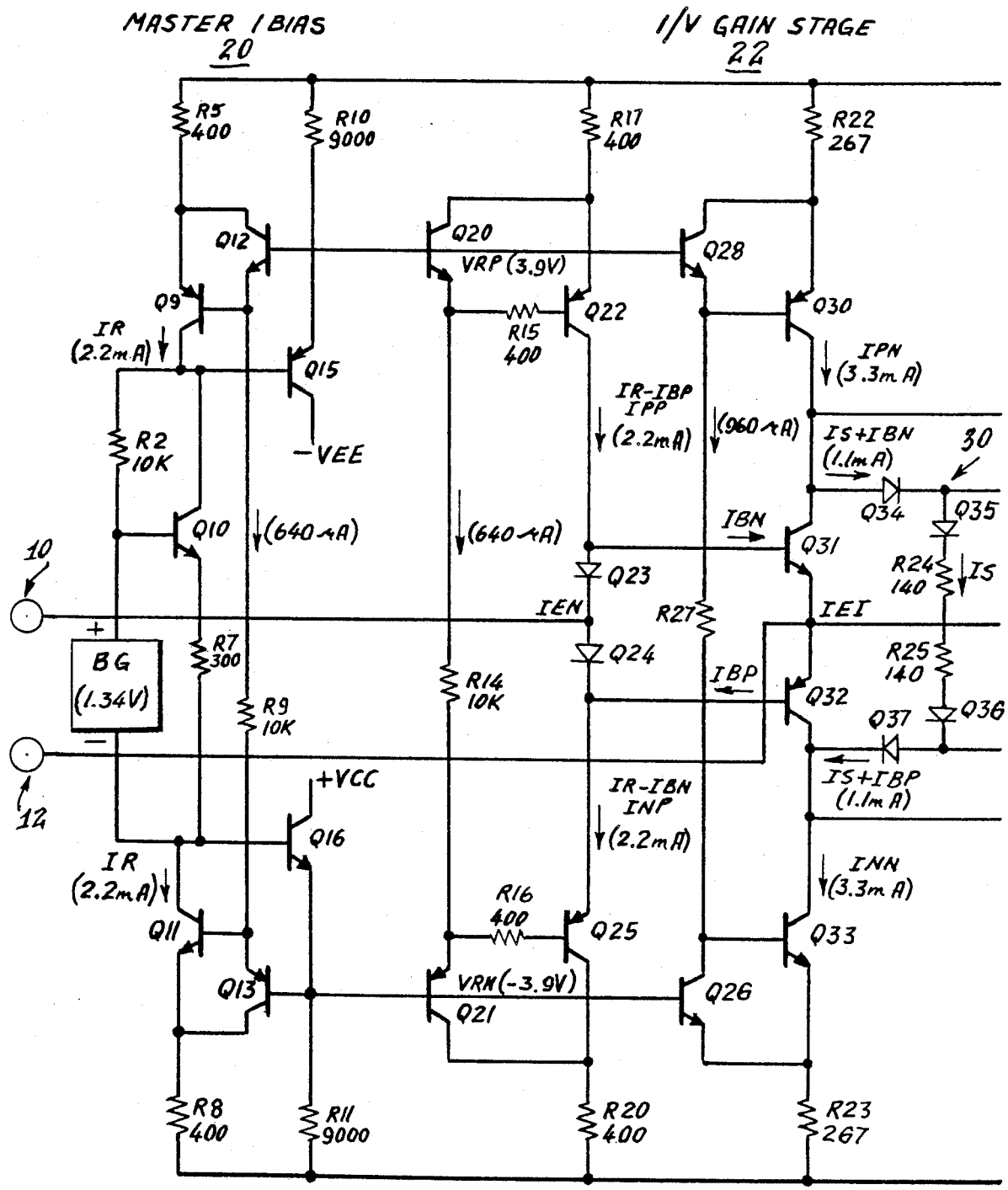
FIGS. 2A and 2B are a detailed schematic diagram showing the circuit arrangement of a preferred amplifier in accordance with the invention.
Figure 2B:
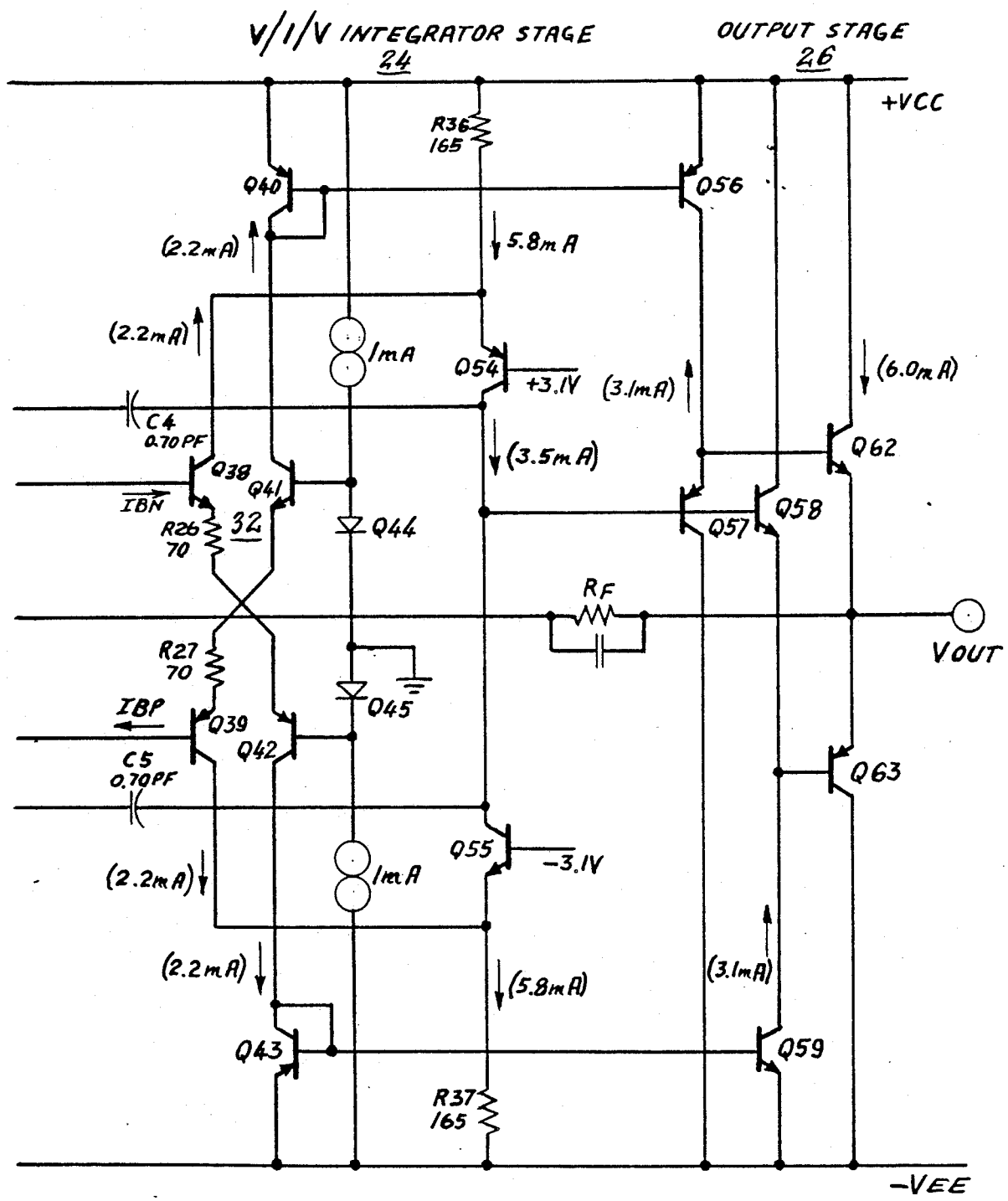

Referring now also to FIG. 2, the overall circuit includes four principal sections labelled at the top of the drawing as Master I Bias 20, I/V Gain Stage 22 (A1 in FIG. 1), V/I/V Integrator Stage 24 (A2 and A3 in FIG. 1), and Output Stage 26 (A4 in FIG. 1). The Master I Bias generator provides equal and opposite reference (bias) currents via current mirrors for amplifier stages A1 and A2. The I/V Gain Stage is a current to voltage (transimpedance) common base stage when operated in the inverting mode, and performs a voltage to voltage function when operated in the non-inverting mode. The V/I/V Gain Stage performs a voltage to voltage gain function; this stage provides the second level of amplification necessary to achieve the required overall gain (current-to-voltage). The Output Stage (or buffer) provides current amplification necessary to drive heavy capacitive and/or resistive loads.

The gain stages (A1, A2, A3) are symmetrically arranged in a push-pull differential configuration using equal and opposite complementary NPN and PNP transistors in the AC signal path. In this manner, relatively higher output slew voltages and more gain can be realized with lower DC current biases than can be achieved with an all NPN architecture.

With the amplifier operated in an inverting mode, and assuming an input signal on terminal 12, the input error current will split between Q31 and Q32, tending to turn Q31 off and Q32 on. This raises the voltage at the collector of Q31, and also correspondingly raises the voltage at the collector of Q32. That is, the AC signal is developed as a common mode signal at the output (collectors) of Q31, Q32.

The collectors of Q31, Q32 are connected to respective ends of a bias-generating circuit generally indicated at 30, and including series-connected diodes Q34, Q35, Q36, Q37 and resistors R24 and R25. The intermediate junction point between diodes Q34, Q35 is connected to the base of Q38, and the intermediate junction point between diodes Q36, Q37 is connected to the base of Q39. Correspondingly, the bases of Q41 and Q42 are controlled by diodes Q44, Q45, having their common junction grounded. Q38, Q39 form one transistor pair of a crosscoupled transistor quad, generally indicated at 32, the other transistor pair being designated Q41, Q42. This quad arrangement forms in effect two differential transconductance amplifiers, Q38, Q41 and Q39, Q42.

The impedance of the bias-generator 30 is quite low compared to the output impedance at the collectors of Q31, Q32 or the input impedance of the transistor pair Q38, Q39. For example, the series impedance of the bias-generator 30 may be about 280 ohms. The output impedance of Q31, Q32 and the input impedance of Q38, Q39 should be at least two orders of magnitude greater, and in practice will be about three orders of magnitude greater. Thus the bias-generator appears to be nearly a short circuit, and can in effect be looked at as though it were a battery. However, since the AC signal at the preceding stage output (collectors of Q31, Q32) is common mode, the AC signal will not be absorbed by this low-impedance path, and overall AC gain will b high.

The bias-generating circuit 30 assures proper quiescent DC voltages and currents for both the Q31, Q32 amplifier stage and the following Q38, Q39 transistor pair, due to the essentially zero differential mode gain. Any IB mismatches (due to beta and Early voltage) from pairs Q31, Q32 and/or Q38, Q39 including DC bias current errors (IPN/INN; IPP/INP) will not greatly affect the DC collector currents of Q38/Q41 and Q39/Q42. Q34 and Q35 provide a $V_{BE}$ of level shifting to insure adequate f(t) performance and common mode range for the inverting input transistors Q31, Q32 when operated in non-inverting or differential mode configuration.

Advantageously, certain transistors of the amplifiers A1 and A2 are matched. Specifically, NPN transistors Q25, Q31, Q38 and Q41 are identical, as are PNP transistors Q22, Q32, Q39 and Q42. Diodes Q23, Q24 have the same emitter areas as transistors Q31, Q32, respectively. Diodes Q23, Q24 carry the reference current IR (2.2 mA) as set by Master I Bias 20 through Q22. Thus, Q31, Q32 also carry 2.2 mA, since they are base connected to Q23, Q24, matched thereto respectively.

Transistor Q30 has an emitter area 3/2 that of the standard PNP area (AP) of Q22 etc., and transistor Q33 has an emitter area 3/2 that of the standard NPN area (AN) of Q25, etc. Thus, Q30 and Q33 supply current 3/2 times IR or 3.3 mA. With 2.2 mA forced through Q31, Q32, the current through the bias-generator 30 will be (½) IR, or 1.1 mA.

Diodes Q34, Q35 are half the size of Q38, and diodes Q36, Q37 are half the size of Q39. Diodes Q44, Q45 are matched respectively to Q35, Q36. The emitter resistors R28, R29 of Q38, Q39 have half the resistance of resistors R24, R25. With these relationships, it can be shown that the DC currents through Q38 and Q39 (and through Q41, Q42) are forced to be twice the current through the bias generator 30, i.e. 2.2 mA, just as in Q31, Q32 and Q23, Q24.

DC current precision is assured by running transistor pairs Q31/Q38, Q32/Q39 and Q23/Q24 at equal collector currents. With Q31, Q32 having equal and low $V_{CE}$ voltages, DC voltage accuracy also is obtained.

In more detail, it can be seen that the current entering the bias-generator 30 (ISP)=(½) IR-IBP-2IBN (where IBP is the base current of a standard PNP transistor carrying IR, and IBN is the base current of a standard NPN transistor carrying IR). Similarly, the current leaving the bias-generator (ISN)=(½)IR-2IBP-IBN. The collector current of Q31 (1.5IR-ISP) is IR-IBP-2IBN, and its emitter current is IR-IBP-IBN. Likewise, the collector current of Q32 (1.5IR-ISN) is IR-2IBP-IBN and its emitter current is IR-IBP-IBN. It will be noted from this, that the DC emitter currents for Q31, Q32, when used to drive the cross-coupled quad transconductance amplifier 32, will be equal, so that (to the first order) there will be no input bias current at the inverting input point (junction of the emitters).

The current through the diode Q23 can be seen to be IR-IBP-IBN (noting that the current from Q22 is IPP =IR-IBP). Similarly, the current through the other diode Q24 is also IR-IBP-IBN. Thus, again to the first order, there will be no input bias current at the non-inverting input point.

With the arrangement described, an increase in voltage at the collectors of Q31 and Q32 (caused by a signal at the inverting input 12) will be translated through to the bases of Q38, Q39 and alter the flow of currents through those transistors, as well as the currents through the other pair Q41, Q42. Specifically, the current through Q38 (and Q42) will increase, while the current through Q39 (and Q41) will decrease. These current changes will be reflected in the emitter currents of Q54, Q55, decreasing the former, and increasing the latter. This is because the current through R36 (and R37) is relatively fixed, because the bases of Q54, Q55 are tied to reference voltages (+3.1V and −3.1V), and because the nodes at the emitters of those transistors are low impedance relative to R36, R37, so that a change in current through Q41, Q42 will cause a corresponding change in current through Q54, Q55.

With these changes in current through Q54 and Q55, the voltage developed at the common collectors of these transistors will correspondingly change, thereby altering the drive on the common bases of transistors Q57, Q58. The emitter voltage outputs of these transistors will correspondingly change by the same amount thereby altering the drive on the two series-connected output buffer transistors Q62, Q63. The outputs (emitters) of those transistors will change by the same amount and cause the output voltage to decrease.

Reverting to the cross-coupled quad circuit 32, the change in currents through the second pair of transistors Q41, Q42 is sensed by corresponding diode-connected transistors Q40, Q43 which are mirrored to respective transistors Q56, Q59. The resulting change in current through the latter transistors augments the signals applied to the output transistors Q62, Q63. In effect, the second pair of quad transistors Q41, Q42 cooperate with Q40, Q43 to provide an extra port to add to the amplifier gain, reducing the standing current and power required for the output transistors Q54, Q55, and increasing the speed and stability of operation.

Although a specific preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein. Parameter values are in some cases disclosed herein or shown on the circuit diagram; these are intended only to be illustrative without necessarily representing final values which can be selected for particular applications.

What is claimed is:

1. A DC-coupled transimpedance amplifier with current feedback to provide DC precision and high loop gain, and including a successive series of balanced symmetrical amplifier stages, comprising:
    a first amplifier stage having a first pair of series-connected complementary transistors each including a base;
    each of said first pair of transistors further including emitter and collector electrodes with one pair of like electrodes connected together;
    input means for applying an input signal to said first amplifier stage;
    a bias-generating circuit connected between the other pair of like electrodes of said first pair of transistors;
    said bias-generating circuit including a plurality of series-connected diodes;
    a second amplifier stage comprising a second pair of complementary transistors each including base, emitter and collector;
    means connecting said bases of said second pair of transistors to respective intermediate points of said series-connected bias-generating circuit to provide biasing voltages to said bases and to furnish signals thereto from said other pair of like electrodes of said first pair of transistors; and output means connected to said second pair of transistors to receive the output thereof and to develop an output signal.

2. Apparatus as claimed in claim 1, wherein said one pair of electrodes are the emitters of said first pair of transistors.

3. Apparatus as claimed in claim 2, wherein said input means comprises a pair of series-connected diodes generating bias voltages for the bases of said first pair of transistors.

4. Apparatus as claimed in claim 2, wherein said first pair of transistors are matched to said second pair of transistors;

said input means comprising means to connect an input signal to the common emitter connection of said first pair of transistors; and circuit means for developing equal DC collector currents through all of said first and second pairs of transistors, whereby to provide for equal base currents resulting in minimal input bias current.

5. Apparatus as claimed in claim 1, wherein the series impedance of said bias-generating circuit is at least an order of magnitude less than the output impedance of said first pair of transistors or the input impedance of said second pair of transistors.

6. A DC-coupled transimpedance amplifier with current feedback to provide DC precision and high loop gain, and including a successive series of balanced symmetrical amplifier stages, comprising:

a first amplifier stage having a first pair of series-connected complementary transistors each including a base;

said first pair of transistors each further including emitter and collector electrodes with one pair of like electrodes connected together;

input means coupled to said first pair of transistors for applying an input signal to said first amplifier stage;

a second amplifier stage comprising second and third pairs of complementary transistors each including base, emitter and collector;

said second and third pairs of transistors being cross-coupled such that one of said second pair is in series with a complementary one of said third pair, and the other of said second pair is in series with the other of said third pair;

means coupling said bases of said second pair of transistors to the other pair of like electrodes of said first pair of transistors to be driven thereby;

a third amplifier stage coupled to said second pair of transistors to receive an output therefrom; and output means coupled to said third amplifier stage to develop an output signal.

7. Apparatus as claimed in claim 6, wherein said like electrodes are the emitter electrodes of said first pair of transistors.

8. Apparatus as claimed in claim 7, including current control means for developing equal currents through all of said transistors of said second and third pairs of transistors.

9. Apparatus as claimed in claim 8, wherein said current control means establishes a current through said second and third pairs of transistors equal to the current through said first pair of transistors.

10. Apparatus as claimed in claim 7, wherein said third amplifier stage is coupled to the collectors of said second pair of transistors; and first and second transistor means coupled to the collectors of said third pair of transistors and to said third amplifier stage for augmenting the output signal developed by said amplifier.

11. A DC-coupled transimpedance amplifier with current feedback to provide DC precision and high loop gain, and including a successive balanced symmetrical amplifier stages, comprising:

a first amplifier stage having a first pair of series-connected complementary transistors each including base, emitter and collector electrodes with the emitters connected together;

bias-setting means for said bases;

first and second input means coupled respectively to the common emitters of said first pair of transistors and to said bias-setting means for applying an input signal to said first amplifier stage;

a bias-generating circuit connected between the collectors of said first pair of transistors;

said bias-generating circuit including a plurality of series-connected diodes;

a second amplifier stage comprising second and third pairs of complementary transistors each including base, emitter and collector;

said second and third pairs of transistors being cross-coupled such that one of said second pair is in series with a complementary one of said third pair, and the other of said second pair is in series with the other of said third pair;

means connecting said bases of said second pair of transistors to respective intermediate points of said series-connected bias-generating circuit to provide biasing voltages to said bases and to furnish signals thereto from said collectors of said first pair of transistors; and output means connected to the collectors of said second pair of transistors to develop an output signal.

12. Apparatus as claimed in claim 11, wherein said second and third pairs of transistors are identical and carry identical DC currents.

13. Apparatus as claimed in claim 12, wherein said first pair of transistors is identical to said second and third pairs of transistors and carry DC current identical to that carried by said second and third pairs.

14. Apparatus as claimed in claim 13, wherein said bias-setting means comprises a pair of series-connected diodes having the same emitter areas as said first pair of transistors and carrying DC current identical to that carried by said first pair of transistors.

15. Apparatus as claimed in claim 13, wherein said series-connected diodes of said bias-generating circuit have emitter areas half the size that of said second and third pairs of transistors.

16. Apparatus as claimed in claim 11, including first and second transistor means connected to said third pair of transistors respectively to receive current therefrom; and means coupling said first and second transistor means to said output means to augment the amplified output signal produced thereby.

17. Apparatus as claimed in claim 15, wherein said first and second transistor means comprises current mirrors providing extra ports for the amplifier.

* * * * *